United States Patent [19]

DiLorenzo et al.

[11] 3,904,449

[45] Sept. 9, 1975

[54] GROWTH TECHNIQUE FOR HIGH EFFICIENCY GALLIUM ARSENIDE IMPATT DIODES

[75] Inventors: James Vincent DiLorenzo, Piscataway; Lars Christian Luther, Basking Ridge, both of N.J.

[73] Assignee: Bell Telephone Laboratories, Incorporated, Murray Hill, N.J.

[22] Filed: May 9, 1974

[21] Appl. No.: 468,519

[52] U.S. Cl. ............... 148/175; 148/174; 148/33.5; 252/62.3 GA; 427/84; 357/13; 357/15

[51] Int. Cl.[2] ........................................... H01L 7/36

[58] Field of Search .................. 148/175, 33.5, 174; 252/62.3 GA; 117/215; 357/13, 15

[56] References Cited

UNITED STATES PATENTS

| | | | |
|---|---|---|---|
| 3,483,441 | 12/1969 | Hofflinger | 148/175 X |
| 3,721,583 | 3/1973 | Blakeslee | 117/215 |
| 3,762,945 | 10/1973 | DiLorenzo | 117/215 |
| 3,849,789 | 11/1974 | Cordes et al. | 357/15 |

OTHER PUBLICATIONS

Journal of Applied Physics, Vol. 44, No. 1, pp. 314–324, Jan., 1973, QC 1.J82.

*Primary Examiner*—G. Ozaki
*Attorney, Agent, or Firm*—P. V. D. Wilde

[57] ABSTRACT

High efficiency GaAs Schottky barrier IMPATT diodes comprising a non-uniformly doped depletion region are fabricated by instantaneously injecting a known volume of a known concentration of dopant at a known pressure during chemical vapor deposition epitaxial growth of the $n$ layer forming the depletion region. This technique has yielded $n^+$ layers 150 Angstroms thick, doped to carrier concentration values as high as $10^{18}$ cm$^{-3}$, with precise control of the position of the $n^+$ layer within the depletion region.

5 Claims, 6 Drawing Figures

GROWTH TECHNIQUE FOR HIGH EFFICIENCY GALLIUM ARSENIDE IMPATT DIODES

BACKGROUND OF THE INVENTION

1. Field of the Invention

The invention relates to a technique for the fabrication of a semiconductor diode and, more particularly, to a technique for fabricating high efficiency GaAs Schottky barrier diodes including a non-uniformly doped depletion region.

2. Description of the Prior Art

There is considerable interest currently in solid state microwave energy sources. Such sources promise to be more compact and less expensive, and to have considerably longer life than microwave tubes.

Among the most promising forms of solid state microwave sources is the *imp*act-*a*valanche *t*ransit-*t*ime (IMPATT) diode disclosed in U.S. Pat. Nos. 2,899,646 and 2,899,652, which issued to W. T. Read, Jr., on Aug. 11, 1959. A characteristic of such a diode is a multi-zone semiconductive element which, when operating, includes a depletion region comprising an avalanche region and a drift region. A rectifying barrier, such as a Schottky barrier, contacts the avalanche region. A dynamic negative resistance is achieved by introducing an appropriate transit time to avalanching carriers in their travel across the drift region.

Early investigations have centered on increasing both the output power and the frequency of operation of these devices. More recent studies have involved increasing the output efficiency, which, for GaAs IMPATT diodes, has typically ranged from about 10 to 15 percent.

It is now known that high efficiency (about 25 to 30 percent) GaAs IMPATT diodes may be obtained by more precisely defining the avalanche region. This can be realized by forming a region of high doping level, or "clump" of charge, at a particular depth below the Schottky barrier contact, within that part of the body of the device that normally forms the depletion region when in operation. In this description, that region is termed the active layer. The location of the charge clump is determined by desired operating frequency and efficiency considerations.

In forming the charge clump, the dopant is normally introduced during chemical vapor deposition (CVD) epitaxial growth of the active layer using either a low flow rate (about $10^{-3}$ $cm^3$/min to $10^{-1}$ $cm^3$/min) of a concentrated dopant (such as 500 to 1000 ppm $H_2S/H_2$) or a high flow rate (about 5 $cm^3$/min to 10 $cm^3$/min) of a dopant after a series of diluting steps. A mechanical valve is briefly opened to introduce the dopant. The amount of dopant introduced thus critically depends upon the length of time the valve remains open. In both the low flow case and the high flow case, errors in the quantity of dopant introduced also result from non-reproducibility either of a small orifice used for low-flow rates or of multiple dilutions of the dopant required for high flow rates.

SUMMARY OF THE INVENTION

In accordance with the invention, a known volume of a known concentration of the doping gas at a known pressure is instantaneously injected into the CVD reaction chamber at an appropriate time during epitaxial growth of the *n* layer comprising the depletion region.

The process eliminates time dependence of valve operation and provides a high degree of control and reproducibility over the amount of dopant introduced. This technique has yielded $n^+$ layers 150 Angstroms thick, doped to carrier concentration values as high as $10^{18}$ $cm^{-3}$, with precise control of the position of the $n^+$ layer within the depletion region.

The injection procedure may also be advantageously employed where it is desired to controllably etch the substrate. This occurs when a solid GaAs source is employed, as in the $GaAs/AsCl_3/H_2$ disproportionation reaction. In this case, there is insufficient chloride available to etch the substrate. Thus, precisely controlled amounts of HCl may be injected in accordance with the invention to effect precision etching.

DETAILED DESCRIPTION OF THE INVENTION

Figure 1:
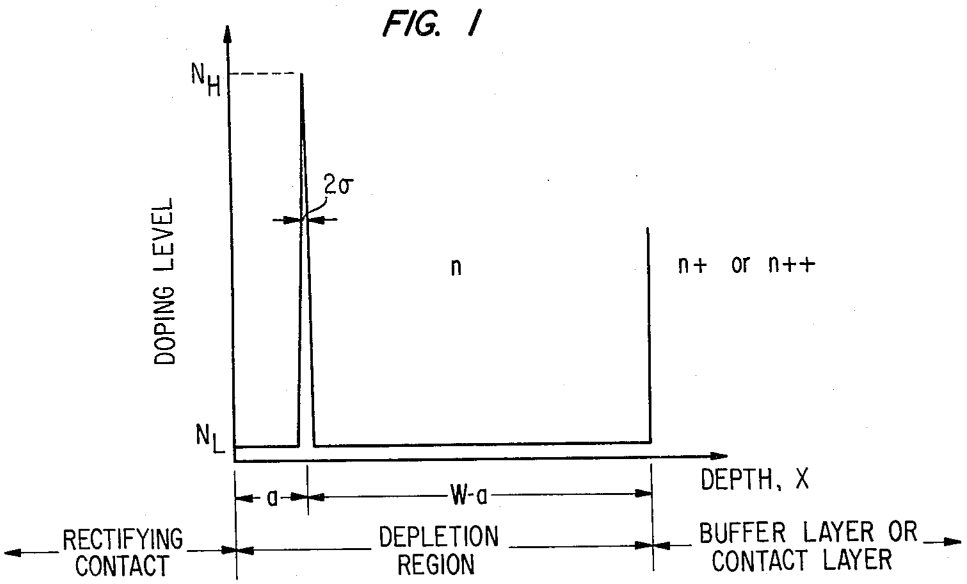
FIG. 1, on coordinates of doping level and distance into the active layer as measured from a rectifying contact, is a plot of an ideal non-uniform doping profile of a high efficiency gallium arsenide IMPATT diode.

IMPATT diodes with depletion regions having a variety of non-uniform doping profiles have been shown to yield high efficiency IMPATT devices; see Vol. 44, *Journal of Applied Physics*, pp. 314–324 (1973). An example of one such structure is illustrated in FIG. 1, which shows a depletion region of width W, comprising an avalanche region *a* and a drift, or transit, region W-*a*. The increase in doping concentration at $x = a$ serves to define the avalanche region more precisely than is possible with uniform doping across the depletion region, as the above reference indicates. For optimum device properties, the width of the avalanche region should range from about 4 to 16 percent of the width of the depletion region.

The efficiency of the device depends on the values of *a*, the charge Q as represented by the number of charge carriers in the highly doped region at $x = a$, and the doping level $N_L$ of the drift region. For a two-step field profile having one transit zone, as shown in FIG. 1, then the charge Q may be approximately determined by the width $2\sigma$ of the highly doped region (measured at 60 percent of the doping level $N_H$) times $N_H$, assuming a gaussian distribution of Q. (The value of Q, is more precisely determined from profilometer measurements.) Preferably, the measured value of Q should range from $1 \times 10^{12}$ $cm^{-2}$ to $3 \times 10^{12}$ $cm^{-2}$ for optimum device properties. In order to maximize the efficiency of the device, the location of the highly doped region and the carrier concentration in that region must be carefully controlled. As shown in the above reference, a theoretical operating efficiency for GaAs IMPATT diodes having the profile depicted in FIG. 1 is 32.3 percent of the input power.

Figure 2:
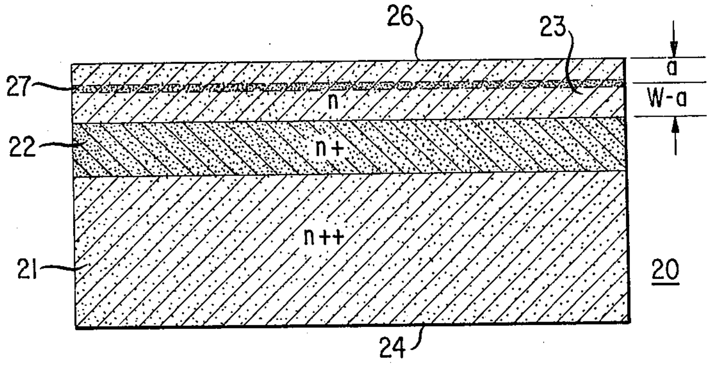
FIG. 2 is a front elevational view in cross section of a gallium arsenide slice including a substrate and two epitaxial layers in which one of the epitaxial layers is doped in accordance with the invention.

For purposes of illustration, a structure 20 is shown in FIG. 2, comprising two epitaxial films 22 and 23 sequentially deposited on a highly doped substrate 21 having a carrier concentration of about $10^{18}$ $cm^{-3}$ and designated $N^{++}$. A first epitaxial "buffer" layer 22, having a carrier concentration of about $4 \times 10^{17}$ $cm^{-3}$ and designated $n^+$, is formed on one surface of the substrate. A second epitaxial "active" layer 23, having a carrier concentration of about $10^{15}$ $cm^{-3}$ and designated *n*, is formed on the surface of the buffer layer, and includes the depletion region. Details of this structure are described in Vol. 52, *Transactions of IEEE*, pp. 1212–1215, 1971, and thus do not form a part of this invention. An IMPATT device may be fabricated, as is well known in the art, by forming an ohmic contact on the exposed surface 24 of the substrate 21 and a rectifying barrier, such as a Schottky barrier contact, on the exposed surface 26 of the active layer 23. An ultrathin layer 27, formed during the deposition of the active layer, comprises the highly doped region for increasing the efficiency of the device.

Figure 3:
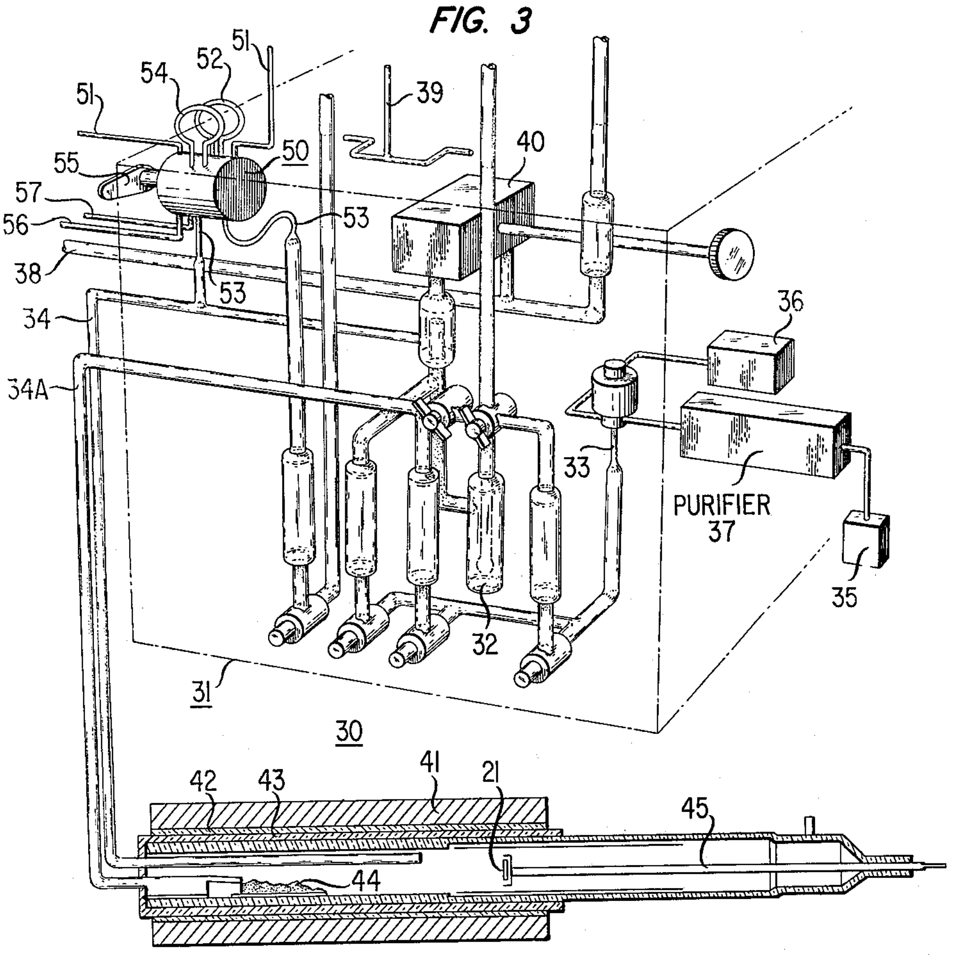
FIG. 3 is a schematic view of a typical apparatus suitable for use in the practice of the present invention.

In FIG. 3, a schematic representation of apparatus 30 used in the practice of the invention is shown. A more detailed description of this system is available elsewhere; see, e.g., J. V. DiLorenzo, U.S. Pat. No. 3,762,945, issued Oct. 2, 1973 and Vol. 17, *Journal of Crystal Growth*, pp. 189–206, 1972. A bubbler system 31 includes a reservoir of arsenic trichloride 32 and conduit means 33, 34, and 34A, respectively, for admitting and removing hydrogen and helium to and from the bubbler system. The system also includes a source of hydrogen 35, a source of helium 36, a hydrogen purifier 37, means 38 for admitting a dopant to the bubbler system, means 39 for admitting nitrogen to the bubbler system, and variable leak valve 40. The apparatus employed also includes a furnace 41 containing a muffle tube 42 and a quartz reaction tube 43.

In the operation of the growth process, heating of the reaction chamber is initiated, hydrogen from source 35 being diffused through palladium-silver membranes in purifier 37 and flowed through control valves in the bubbler system to arsenic trichloride reservoir 32. Hydrogen serves as a carrier gas and transports the arsenic trichloride to reaction chamber 43. Additionally, the hydrogen flow serves as a dilute control for the arsenic trichloride flow and for dopant transfer to the reaction chamber. Reservoir 32 is maintained at a temperature within the range of 15° C to 25° C during growth, and the flow rate of hydrogen is maintained within the range of 300 $cm^3$/min to 400 $cm^3$/min.

Before initiating the vapor transport process, a source of gallium 44 is introduced into chamber 43 which also includes a holder 45, on which is mounted a suitable substrate 21, discussed previously in connection with FIG. 2. A solid source of GaAs may alternatively be employed in place of Ga.

The substrate selected for use is gallium arsenide. Depending on the type of GaAs device being fabricated, the substrate may be oxygen- or chromium-doped semi-insulating, manifesting a maximum resistivity of $10^9$ ohm-cm, as used in GaAs *f*ield *e*ffect *t*ransistor (FET) devices. Alternatively, the substrate may be tellurium-, selenium-, or silicon-doped $n^{++}$, manifesting a resistivity of about 0.003 ohm-cm, as used in GaAs IMPATT diodes. These materials are fabricated using techniques well known to those skilled in the art.

Turning again to the operation of the process, heating of the reaction chamber is continued until the gallium attains a temperature of 760° C to 810° C and the substrate a temperature of 725° C to 760° C, at which point epitaxial growth is initiated at a rate within the range of 0.05 μm/min to 0.3 μm/min. Growth of epitaxial layer 22 of gallium arsenide (FIG. 2) ranging in thickness from 2 μm to 6 μm is continued, the carrier concentration being maintained at a value within the range of $1 \times 10^{17}$ $cm^{-3}$ to $1 \times 10^{18}$ $cm^{-3}$ by the addition to the reaction system of a suitable dopant, typically sulphur, selenium, and the like, via the variable leak valve 40. The thickness and carrier concentration of epitaxial layer 22 are dictated by considerations relating to the desired resistivity of the deposited layer.

Helium may be used, as taught in U.S. Pat. No. 3,762,945, issued Oct. 2, 1973 to J. V. DiLorenzo, to transport additional $AsCl_3$ to etch either the substrate 21 or the first epitaxial layer 22 in order to obtain a smooth uniform transition between the layers and to prevent the formation of any interfacial layers.

Figure 4A:
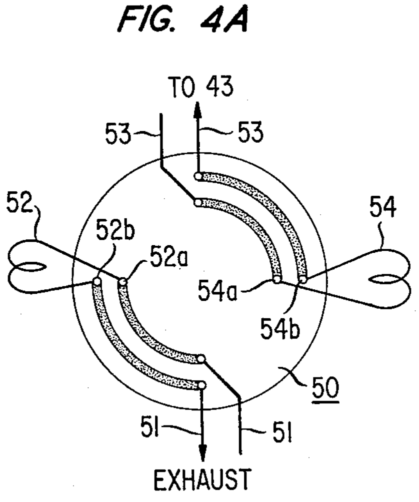
FIGS. 4A and 4B comprise a detailed schematic view of a constant volume gas loop injection valve used in accordance with the invention to introduce a controlled quantity of a gas, e.g., a dopant, into the apparatus of FIG. 3.
Figure 4B:
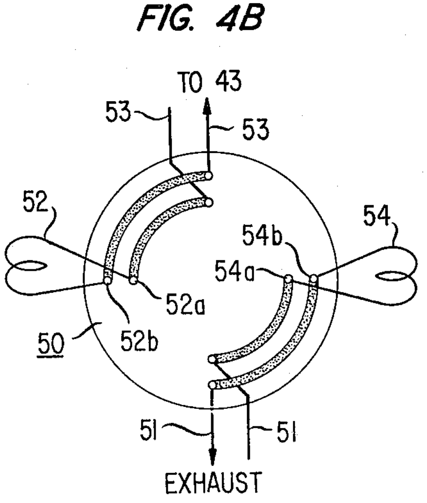

Growth of a second epitaxial layer 23 of gallium arsenide (FIG. 2) ranging in thickness from 4 μm to 8 μm is carried out as above, with the carrier concentration being maintained at a value within the range of $1 \times 10^{15}$ $cm^{-3}$ to $1 \times 10^{16}$ $cm^{-3}$, again introducing a suitable dopant through the variable leak valve 40. The thickness and carrier concentration of epitaxial layer 23 are dictated by considerations relating to the desired operating frequency of the finished device, with lower operating frequency associated with greater thickness and lower carrier concentration.

Where it is desired to form a highly doped region 27, then at an appropriate time during the growth of epitaxial layer 23, and in accordance with the invention, a known volume of a known concentration of the dopant at a known pressure is instantaneously injected into the reaction chamber. This is conveniently achieved by using, for example, commercially available 100 ppm to 1000 ppm $H_2S/H_2$ as the dopant source and a gas injection valve 50. As shown in FIG. 3, and in schematic detail in FIGS. 4A and 4B, the dopant gas continuously flows at a constant rate through a tube 51 to exhaust to the atmosphere. A portion of the tube defines a constant volume region 52 between two switching points **52*a* and 52*b*. The carrier gas flows through a second tube 53, to the reaction chamber 43. A portion of the second tube may also define a constant volume region 54 between two switching points 54*a* and 54*b*. At an appropriate time, both switching points are inverted by handle 55 so that the carrier gas sweeps out the dopant gas trapped in the constant volume region 52 into the reaction chamber. The valve mechanism is surrounded by an inert gas, such as helium, which is introduced via tube 56 and which exhausts to the atmosphere via tube 57**.

From the gas law, $$n = \frac{RT}{PV}, \tag{1}$$

where *n* is the amount of the dopant in moles, R the gas constant, T the temperature in degrees Kelvin, P the pressure of the dopant gas, and V the volume of the dopant gas. By using a known concentration of the dopant (e.g., 1000 ppm $H_2S/H_2$) flowing at a known pressure, then the width of the highly doped region 27 depends only on (1) the growth rate of the second epitaxial layer 23 and (2) the volume of dopant gas injected into the carrier gas stream as determined by the constant volume region 52. If a portion of the second tube 53 also defines a constant volume region 54, then repeated switching may be performed to obtain a series of highly doped regions in the epitaxial layer, without interrupting the growth of the layer.

Use of the inventive technique permits formation of the highly doped region 27 (FIG. 2) ranging in width from 100 to 700 Angstroms. This width is thinner than heretofore obtained following prior art procedures. The growth of the second epitaxial layer continues uninterrupted until a final desired thickness is obtained, to form the low-high-low modified Read structure of FIG. 1. Alternatively, growth may be stopped after the injection to form a high-low modified Read structure. Other nonuniformly doped structures may also be fabricated in accordance with the invention. The slice is then further processed to fabricate an IMPATT diode by methods well known in the art, as mentioned earlier.

The foregoing CVD reaction has been described in terms of the $Ga/AsCl_3/H_2$ disproportionation reaction, where etching of the substrate 21 or first epitaxial layer 22 is performed by $AsCl_3$ carried on helium gas. However, in the case where a solid source of GaAs is employed, such as in the $GaAs/AsCl_3/H_2$ disproportionation reaction, there is insufficient chloride (HCl or $Cl_2$) available for etching. In such a case, the instantaneous injection technique may be advantageously employed to inject a precisely controlled amount of HCl gas to effect precision etching. The apparatus shown in FIG. 3 may then include a second injection valve at an appropriate location to introduce the HCl through conduct means 34 to the substrate 21. This technique would also be advantageous, for example, where it is desired to etch portions of layer 23 exposed by conventional photolithographic masking techniques, during the fabrication of source and drain regions in FETs.

EXAMPLE

Square wafers 1 in. on a side were positioned upright in a $Ga/AsCl_3/H_2$ vapor deposition reactor similar to that shown in FIG. 3. The deposition of the second epitaxial layer was preceded by an in situ etch of the GaAs substrate in $AsCl_3/He$ and growth of a 4 $\mu$m thick $n^+$ buffer layer. An 8 port injection valve (Varian Aerograph model 57–000168–00) having two exchangeable sample loops was employed to inject the dopant. Turning the valve handle 55 by 90° results in an interchange of the contents of the two loops 52 and 54. The valve may be operated every few seconds without loss of doping control.

Typically, $H_2S$ having a volume of 0.7 ml at a concentration of 300 ppm and 2 atm pressure was injected once, corresponding to $n = 1.7 \times 10^{-8}$ moles and containing $1.0 \times 10^{16}$ S atoms. At a growth rate of 0.08 $\mu$m/min, this amount of $H_2S$ yielded a highly doped region, or charge clump, containing a charge Q of $2 \times 10^{12}$ cm$^{-2}$. Other examples of non-uniformly doped active layers formed at different growth rates are shown in Table I.

Table I

| Sample No. | Growth rate, $\mu$m/min. | Total amount of impurity $Q \times 10^{12}$, cm$^{-2}$ | Profile width, Angstroms |
|---|---|---|---|
| 167 | 0.070 | 2.1 | 160 |
| 168 | 0.10 | 1.5 | 200 |
| 176 | 0.12 | 1.8 | 230 |
| 240 | 0.17 | 3.0 | 250 |
| 231 | 0.083 | 1.7 | 150 |
| 287 | 0.065 | 1.1 | 470 |

Figure 5:
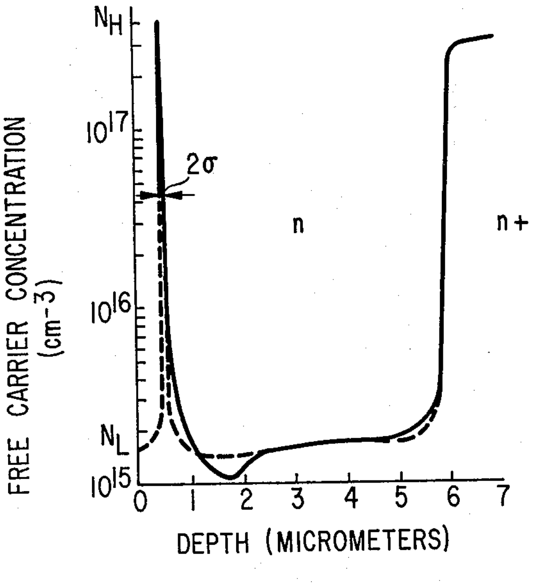
FIG. 5, on coordinates of doping level and distance into the active layer as measured from the rectifying contact, is an example of a doping profile of a GaAs slice fabricated in accordance with the invention.

A typical doping profile, measured on a conventional capacitance-voltage profilometer, is shown in FIG. 5. The solid line represents the measured C-V profile. The value of Q, as determined from the C-V measurement, is $1.4 \times 10^{12}$ cm$^{-2}$. The dotted line is believed representative of the underlying impurity distribution. The dip in the background doping is apparently a spurious artifact.

After further conventional processing of slices to fabricate IMPATT diodes, measurements were obtained of the total amount of impurity Q in the charge clump, the operating frequency $f$ of the device, and the operating efficiency $\eta$ for the amount of input power $P_i$. These results are given in Table II.

Table II

| Sample No. | $Q \times 10^{12}$ cm$^{-2}$ | f, GHz | $\eta$, percent | $P_i$, watts | $P_o$, watts |
|---|---|---|---|---|---|
| 235 | 2.0 | 7.1 | 20 | 28 | 5.5 |
| 176 | 2.0 | 10.4 | 20 | 20.5 | 4.2 |
| 223 | 1.8 | 9.5 | 20 | 14.4 | 2.9 |
| 257 | 1.3 | 5.7 | 17 | 33 | 5.7 |

What is claimed is:

1. A process for fabricating a high efficiency gallium arsenide Schottky barrier diode comprising:

a. depositing at least one layer of gallium arsenide on a first surface of a gallium arsenide substrate by vapor phase epitaxy from materials including a source of gallium, a source of arsenic, and a conductivity-type determining impurity, the materials being transported to the substrate by a carrier gas of hydrogen;

b. forming a thin film of gallium arsenide, ranging in thickness from 100 Angstroms to 700 Angstroms, which includes a relatively higher concentration of the impurity as compared with the deposited gallium arsenide layer by injecting substantially instantaneously into the carrier gas at constant pressure a constant volume of a gas containing a predetermined concentration of the impurity, the injection occurring during the deposition of the gallium arsenide layer;

c. forming an electrical contact on a second surface of the gallium arsenide substrate; and d. forming a rectifying barrier contact on the deposited gallium arsenide layer.

2. The process of claim 1 in which prior to depositing a layer of gallium arsenide, the first surface of the gallium arsenide substrate is chloride-etched by a process including injecting substantially instantaneously into a carrier gas at constant pressure a constant volume of hydrogen chloride.

3. The process of claim 1 including:

a. depositing at least one layer of gallium arsenide on a first surface of a gallium arsenide substrate by vapor phase epitaxy from materials including a source of gallium, a source of arsenic, and a conductivity-type determining impurity, the materials being transported to the substrate by a carrier gas of hydrogen;
b. forming a thin film of gallium arsenide, ranging in thickness from 100 Angstroms to 700 Angstroms, which include a relatively higher concentration of the impurity as compared with the deposited gallium arsenide layer by injecting substantially instantaneously into the carrier gas at constant pressure a constant volume of a gas containing a predetermined concentration of the impurity, the injection occurring during the deposition of the gallium arsenide layer;
c. continuing depositing the gallium arsenide layer to a desired thickness;
d. forming an electrical contact on a second surface of the gallium arsenide substrate; and
e. forming a Schottky barrier contact on the deposited gallium arsenide layer.

4. The process of claim 3 including:
a. depositing in sequence two layers of gallium arsenide on a first chloride-etched surface of a gallium arsenide substrate by vapor phase epitaxy from materials including gallium, arsenic trichloride and a source of n-type determining impurity of sulfur, the materials being transported to the substrate by a carrier gas of hydrogen, in which a first layer of gallium arsenide having a carrier concentration of about $1 \times 10^{17}$ cm$^{-3}$ to $1 \times 10^{18}$ cm$^{-3}$ and a thickness of about 2 $\mu$m to 6 $\mu$m is deposited on a gallium arsenide substrate having a resistivity of about 0.003 ohm-cm and in which a second layer of gallium arsenide having a carrier concentration of $1 \times 10^{15}$ cm$^{-3}$ to $1 \times 10^{16}$ cm$^{-3}$ and having a thickness ranging from 4 $\mu$m to 8 $\mu$m is deposited on the first layer;
b. forming a thin film of gallium arsenide during deposition of the second gallium arsenide layer, the thin film ranging in thickness from 100 Angstroms to 700 Angstroms and including a carrier charge Q ranging from $1 \times 10^{12}$ cm$^{-2}$ to $3 \times 10^{12}$ cm$^{-2}$ by injecting substantially instantaneously at constant pressure a constant volume of a gas containing from 100 ppm to 1000 ppm $H_2S/H_2$;
c. continuing depositing the second gallium arsenide layer to a desired thickness;
d. forming an ohmic contact on a second surface of the gallium arsenide substrate; and
e. forming a Schottky barrier contact on the second gallium arsenide layer.

5. The process of claim 3 which additionally includes a step of etching at least portions of the first gallium arsenide layer by a process including injecting substantially instantaneously into a carrier gas at constant pressure a constant volume of hydrogen chloride, prior to depositing the second layer of gallium arsenide.

* * * * *